US006313683B1

(12) United States Patent
Block et al.

(10) Patent No.: US 6,313,683 B1
(45) Date of Patent: Nov. 6, 2001

(54) METHOD OF PROVIDING CLOCK SIGNALS TO LOAD CIRCUITS IN AN ASIC DEVICE

(75) Inventors: Stefan Block; Bernd Ahner, both of Munich; David Reuveni, Taufkirchen; Benjamin Mbouombouo, Munich, all of (DE)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/301,278

(22) Filed: Apr. 28, 1999

(30) Foreign Application Priority Data

Apr. 29, 1998 (EP) .................................................. 98107883

(51) Int. Cl.[7] ...................................................... G06F 1/04
(52) U.S. Cl. ............................................ 327/295; 327/565
(58) Field of Search .................................... 327/141, 161, 327/163, 261, 270, 293, 295, 565

(56) References Cited

U.S. PATENT DOCUMENTS

| 5,329,188 |   | 7/1994  | Sikkink et al. ........................ 327/18 |
| 5,452,239 | * | 9/1995  | Dai et al. ................................ 703/19 |
| 5,453,993 |   | 9/1995  | Kitaguchi et al. ..................... 714/33 |
| 5,686,845 | * | 11/1997 | Erdal et al. ............................ 326/93 |
| 5,996,083 | * | 11/1999 | Gupta et al. .......................... 713/322 |

FOREIGN PATENT DOCUMENTS 0 825 513   2/1998  (EP) .

OTHER PUBLICATIONS

Jim Lipman, "Growing Your Own IC Clock Tree", EDN Electrical Design News, Mar. 14, 1997, pp. 40–46, 48.
David D. Keezer et al. "Clock Distribution Strategies for WSI: A Critical Survey", 1991 International Conference on Wafer Scale Integration, pp. 277–283.

\* cited by examiner

*Primary Examiner*—Toan Tran
*Assistant Examiner*—Cassandra Cox
(74) *Attorney, Agent, or Firm*—Westman Champlin & Kelly PA (57) ABSTRACT

An ASIC device and method provide clock signals to load circuits having a balanced clock tree including a master clock line, for example a clock trunk or H-tree, and branched clock lines feeding the clock signals to load circuits and being balanced with respect to the delays and loads in domains of the ASIC device to which the branched clock lines supply the clock signals. The ASIC device and method generate derived clock signals by gating the master clock signal, in which the derived clock signals have a frequency reduced by a factor $n>1$ ($n=2, \ldots, N$), which is adapted to the need of the load circuits in a particular domain, and route the master clock signal and/or the derived clock signal for a particular domain to the load circuit of said domain.

21 Claims, 5 Drawing Sheets

METHOD OF PROVIDING CLOCK SIGNALS TO LOAD CIRCUITS IN AN ASIC DEVICE

This application claims the benefit of European Application No. 98107883.5 filed Apr. 29, 1998, which is hereby incorporated by reference.

FIELD OF THE INVENTION

The invention relates to a method of providing clock signals to load circuits (FFS) in a ASIC device having a balanced clock tree system including a master clock line, for e.g. a clock trunk or H-tree system, and branched clock lines feeding the clock signals to the load circuits and being balanced with respect to the delays and loads in domains of the ASIC device to which the branched clock lines supply clock signals.

The invention also relates to a method of providing clock signals to load circuits in a ASIC device having a plurality of balanced clock tree systems each including a master clock line, for example a clock trunk or H-tree system, and branched clock lines feeding the clock signals to load circuits and being balanced with respect to the delays and loads in domains of the ASIC device to which the branched clock lines supply clock signals.

Furthermore, the invention also relates to an ASIC device having a clock signal system for providing clock signals to load circuits in the ASIC device.

BACKGROUND OF THE INVENTION

There is a trend in the market for ASIC devices that are becoming more and more power-sensitive. As the geometries are becoming ever smaller, ASIC devices having more than 500 K gates are becoming the norm. Furthermore, there is a trend that the ASIC devices are incorporating ever more logic functions. Additionally, the frequencies of operation for such ASIC devices are also increasing. This, in turn, results in ASIC devices that consume more and more power. For such ASIC devices in the area of laptop computing and wireless communication as well as in many consumer products, the biggest cost factor nowadays is power consumption. Therefore, new designs of ASIC devices have to be developed in order to save power.

One way to save power is to turn off sections of the logic circuitry that are not active, and to allow the sections of the circuitry to be active only when needed. Among others, power can be saved by putting logic circuitry to a "sleep" mode with an interrupting mechanism to "wake up" the logic circuitry when needed or to run the different domains of the ASIC device with as slow clock frequencies as possible. The last mentioned possibility poses, however, the problem that the various clock signals having different frequencies have to be synchronized and such a synchronization is impaired by the skew effect which comes about because of the difference in time that the clock signals need to reach the flip flop which is nearest to the clock driver as compared to the time needed for the clock signals to arrive at the flip flop which is most distant from the clock driver.

As can be seen from the above, the distribution of clock signals is getting ever more important with increasing integration density and increasing clock rates in complex ASIC devices. Therefore, clock schemes, such as the single ended driver scheme, the double ended driver scheme, the local buffering scheme and the H-tree scheme, have been developed to assure, within a particular chip, that the skew on the clock signal lines does not exceed a maximum value which depends on the particular technology used.

The clock line network is the most critical network as concerns the design of the ASIC device. The fanout and the capacitive load related thereto is higher by two or three orders of magnitude as compared to such values in usual signal networks. Furthermore, the clock signal network extends generally across the hole surface of the chip, and the skew produced mainly by RC delays, has the effect that the clock signal is not synchronously provided at all the circuits which need the clock signal.

One has tried to solve the problem of the skew by providing an on-chip PLL circuit in the ASIC device itself to synchronize the various clock signals. In other words, in the prior art, each derived clock signal was generated asynchronously, and synchronization stages have been used to transfer the clock signals from one clock domain to another domain. However, this solution adds to the complexity of the ASIC device itself. Furthermore, the prior art solution is costly in terms of logic required and is not working in all the applications.

SUMMARY OF THE INVENTION

In view of the above, it is a main object of the invention to provide a method of distributing clock signals to load circuits in an ASIC device and to provide an ASIC device itself in which the method is implemented wherein the problem of skew is under control.

It is another object of the invention to provide a method of distributing clock signals to load circuits in an ASIC device and to provide an ASIC device itself in which the method is implemented wherein the clock signals for the domains of a clock system of the ASIC device are generated, distributed and routed in a synchronous manner irrespective of their frequency.

The method of distributing clock signals to FF-circuits in a ASIC device according to the invention comprises generating derived clock signals by gating the master clock signal which derived clock signals have a frequency reduced by a factor n>1 (n=2, . . . , N) adapted to the need of the load circuits in a particular domain, and routing the master clock signal and/or derived clock signal for a particular domain to the load circuit of said domain whereby the clock signals are generated, distributed and routed in a synchronous manner.

In the method of the invention, all clock signals are generated from the same source, i.e. the master clock signal, and identical timing parameters for all submultiples of the master clock signal are provided by construction. Furthermore, all clock signals are synchronous by construction and the clock signals can be stopped synchronously without spikes to save power. The frequency of the clock signals may be varied on-the-fly in a synchronous manner. Furthermore, all derived clock signals can also be driven at one single frequency to improve scan- or testing efficiency.

In the method of the invention, a derived clock signal is defined as being a clock signal of a lower frequency, generated by gating out the necessary number of master clock cycles. The master clock signal and all derived clock signals will be generated from one single source, i.e. the master clock signal, and laid out as a signal clock net using BCT (balanced clock tree)-tools. By using a gating scheme for all clock signals, each clock domain can be driven at the lowest possible frequency thus reducing the power consumption. The master clock signal and all derived signals are synchronous such that the over all skew can be controlled. It is possible to generate for example a scan mode enable signal which will drive all loads at the same rate for scan testing, reducing test program overhead and complexity.

Finally, only one IO(input/output)-driver is required and only one clock tree, for example a BCT- or an H-tree-system, will be inserted. Clock driver shielding in the IO-ring is necessary only for one clock signal instead of many different signals. These features entail a reduction of the amount of manual work needed to implement the clock systems.

According to an embodiment of the method of the invention, the gating is achieved by blanking out an appropriate number of master clock cycles using an enable signal which is generated for each clock domain. This method ensures that the derived clock signals are generated at the corresponding clock domains while minimizing skew.

According to an embodiment of the method of the invention, the enable signals are generated by using the falling edge of master clock pulses of the master clock signal. This has the advantage that the enable signals are also derived signals from the master clock pulses such that also the enable signals are synchronized with the master clock signals.

According to an embodiment of the method of the invention, the derived clock signals are generated by gating signals which start just after the falling edge of the master clock pulses and at the same time in a following clock period. This method has the advantage that the clock signal edges are protected avoiding spike problems.

The method of the invention described up to now permits all derived clocks to be driven at one signal frequency to improve testing efficiency. However, the test clock signal for a clock system is related to the master clock signal of this system. If two or more clock systems are embodied on one and the same chip, it poses a problem to service all clock systems with the same test clock signal.

Therefore, the invention to provide a method of distributing clock signals to load circuits in an ASIC device and provides an ASIC device itself in which the method is implemented wherein the clock signals for a plurality of clock systems of the ASIC device can be replaced by a single test clock signal for scan-test purposes.

An embodiment of the method of the invention is proposed in which the derived clock signals are generated in multiplexer units to which the enable signal, the master clock signal, a test clock signal and a test enable signal are supplied and which output the master clock signal or the derived clock signal or the test clock signal. By multiplexing the test clock signal through multiplexer units into the clock system, generating the test clock signal is not dependent on any of the master clock signals which might be present on a particular ASIC-device. Therefore, all the multiplexer units in the plurality of clock systems can be supplied with the same test clock signal which even might be asynchronous to the clock signals used in the clock system or in the domains of the clock systems.

By using a uniform test clock signal, all load circuits (FFs) get this identical test clock signal, and the test clock signal has a minimal skew at the loads by construction. It is also much easier to handle only one test clock signal during testing than many test clock signals. In certain routines like the logic built-in self test routine offered by the applicant of the present application, it must be possible to have only one test clock signal. With this advantageous embodiment of the method of the invention, it is possible to use the logic built-in self test routine in all designs of ASIC devices. Furthermore, if all loads have the same test clock signal during testing, it is also easier to do a scan-reordering. Finally, if a scan testing is performed while all loads have the same test clock signal, no data-lock-up latches are needed in the device.

The above described methods also find their counterparts in the ASIC device itself. An ASIC device according to the invention comprises gating circuits for generating derived clock signals by gating the master clock signal generated in a master clock signal generator which derived clock signals have a frequency reduced by a factor of $n>1$ ($n=2, \ldots, N$) adapted to the need of the load circuits in a particular domain, and means for routing the master clock signal and/or derived clock signal for a particular domain to the load circuits of said domain.

As can be seen, it is very easy to adapt the design of the ASIC device for carrying out the above described method. It is only necessary to replace a buffer circuit which is normally used at the entrance of a clock domain being supplied by tributaries which in turn are connected to a main trunk in case of a BCT scheme by gate circuits for generating the derived clock signals.

According to an embodiment of the device of the invention, the gating circuits comprise AND-gates, preferably AND2-gates, a first input of which gate circuits is connected to an enable signal generator, and a second input of which gate circuits is connected to the master clock signal generator. Such AND-gates being a very simple and efficient way to embody the gating circuits.

Another ASIC device of the invention comprises multiplexer units for muliplexing the master clock signal of a clock system or a test clock signal into the clock system, said multiplexer units being controlled by a test enable signal and an inverted test enable signal whereby the master clock signal or the test clock signal is supplied to the clock system.

According to an embodiment of the device of the invention it further comprises gating circuits for generating derived clock signals by gating the master clock signal generated in a master clock signal generator which derived clock signals have a frequency reduced by a factor of $n>1$ ($n=2, \ldots, N$) adapted to the need of the load circuits in a particular domain, and means for routing the master clock signal and/or derived clock signal for a particular domain to the load circuits of said domain, whereby the clock signals are generated, distributed and routed in a synchronous manner.

According to an embodiment of the device of the invention, the gating units comprise multiplexer units which are connected to an enable signal generator, the master clock signal generator, a test-enable signal generator and a test clock generator and which multiplexer units output the master clock signal or the derived clock signal or the test clock signal. In this embodiment of the ASIC device, the advantages of having multiplexer units for being able to multiplex a unitary test clock signal into one or a plurality of clock systems can be achieved just by replacing the gate circuit of the prior embodiments by multiplexer units.

According to an embodiment of the device of the invention, the multiplexer units comprise two AND-gates and an OR-gate supplied by the AND-gates a first input of which multiplexer unit is connected to a gating signal generator, a second input of which multiplexer unit is connected to the master clock signal generator, a third input of which multiplexer unit is connected to a test-enable signal generator and a fourth input of which multiplexer unit is connected to a test clock generator. This is a simple and very efficient manner to embody the multiplexer units.

According to an embodiment of the device of the invention, the gate circuits or the multiplexer units used for generating the derived clock signals are, in case of a BCT system, located at the entrance of a clock domain being supplied by tributaries which in turn are connected to a main trunk or are located at a layer further down the path to the load circuits. The first mentioned alternative is advantageous in cases where a large number of load circuits (FFs) is used, whereas the second mentioned alternative is advantageous in cases where a comparatively small number of load circuits, for example 20 load circuits, per buffer is used.

According to an embodiment of the device of the invention, the control logic circuit comprises a buffer for outputting the test-enable signal and an inverter circuit for outputting the inverted test-enable signal. This control logic circuit serves to multiplex the test clock signal into the multiplexer units and is common to all multiplexer units on the ASIC device.

According to an embodiment of the device of the invention, a buffer or an inverter is provided as a clock driver between the multiplexer unit and the load circuits to improve the performance and supply of the clock signals to the load circuits of the clock domain.

DETAILED DESCRIPTION OF ILLUSTRATIVE EMBODIMENTS

Figure 1:
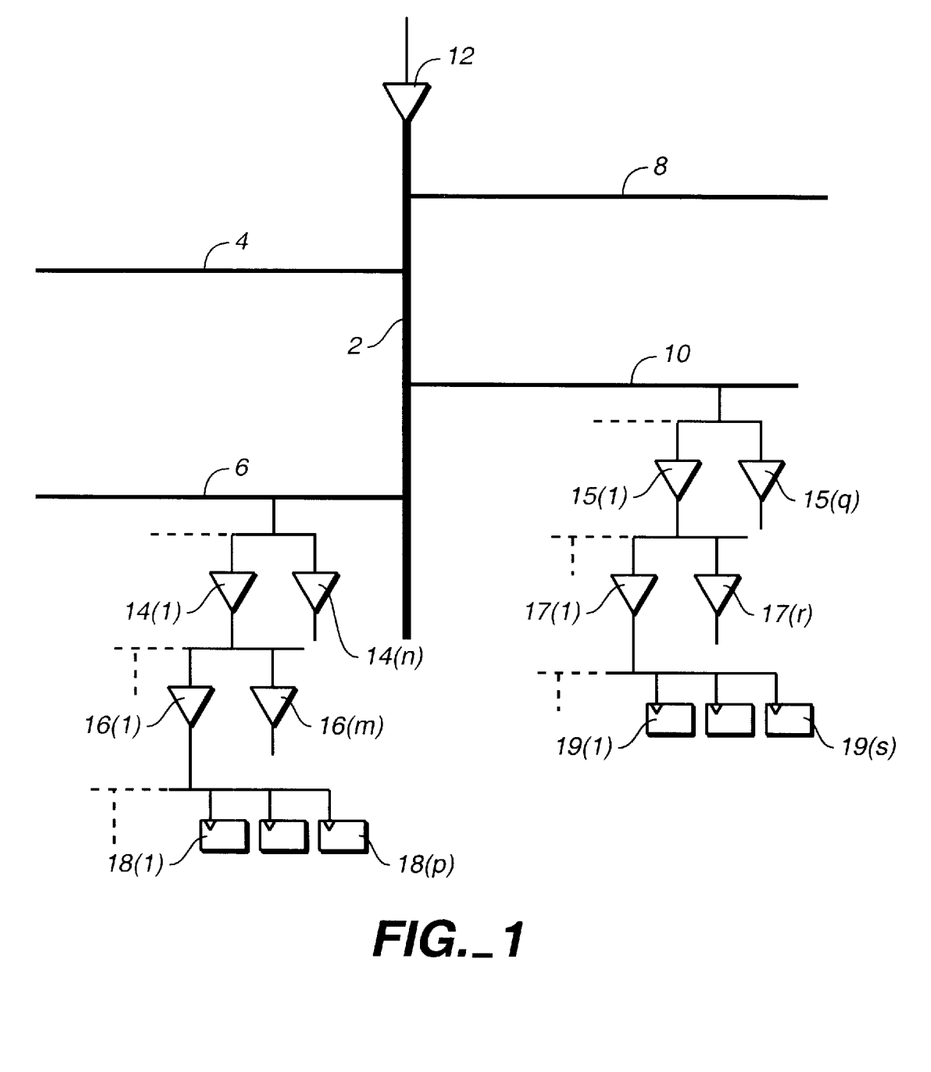
FIG. 1 shows a conventional BCT-clock scheme.

FIG. 1 shows a conventional BCT (balanced clock tree)-system for distributing the clock signals in a clock signal system on a chip. The BCT system includes a clock trunk or a master clock line 2 and branched clock lines 4,6,8,10, so-called tributaries. In such a single-ended clock system, the main clock line 2 is fed from a clock driver 12. Through the tributaries, for example from tributary 6, the clock signals are supplied to a first level of buffers 14(1) . . . 14(n), from there to another level of buffers 16(1) . . . 16(n) and from there to the loads of this domain which are, in the shown example, flip flops 18(1) . . . 18(p).

The same structure or circuit setup is to be found identically also in the domain of tributary 10 as is schematically indicated in FIG. 1. In the domain of tributary 10 the clock signals are supplied to a first level of buffers 15(1) . . . 15(q), from there to another level of buffers 17(1) . . . 17(r) and from there to the loads of this domain which are, in the shown example, flip flops 19 (1) . . . 19 (s). If n=q, m=r and p=s, so that the same number of buffers or loads are in the same level of the tributary 6 and the tributary 10, the respective domains are identical and the branched clock lines 6,10 are balanced with respect to the delays and loads.

Care has to be taken that the load circuits contained in the domains of the branched clock lines 4, 6, 8, 10 and further branched clock lines (not shown) are balanced with respect to the delays and loads in these domains of the ASIC device to which the branched clock lines supply the clock signals.

A clock tree is balanced with respect to the delays and loads when the circuit setup is identical for each signal in each of the domains of a particular tree. In particular each load or buffer is connected to the clock source in an identical manner, and the elements of the circuit setup between the clock source and the load or buffer are also identical or equivalent as concerns the delays and loads. If, for example in FIG. 1, the number n of buffers 14(1) . . . 14(n) is smaller than the number q of buffers 15(1) . . . 15 (q), the balance has to be achieved by providing an additional (q−n) buffers in the level of the buffers 14 to balance the two domains.

Figure 2:
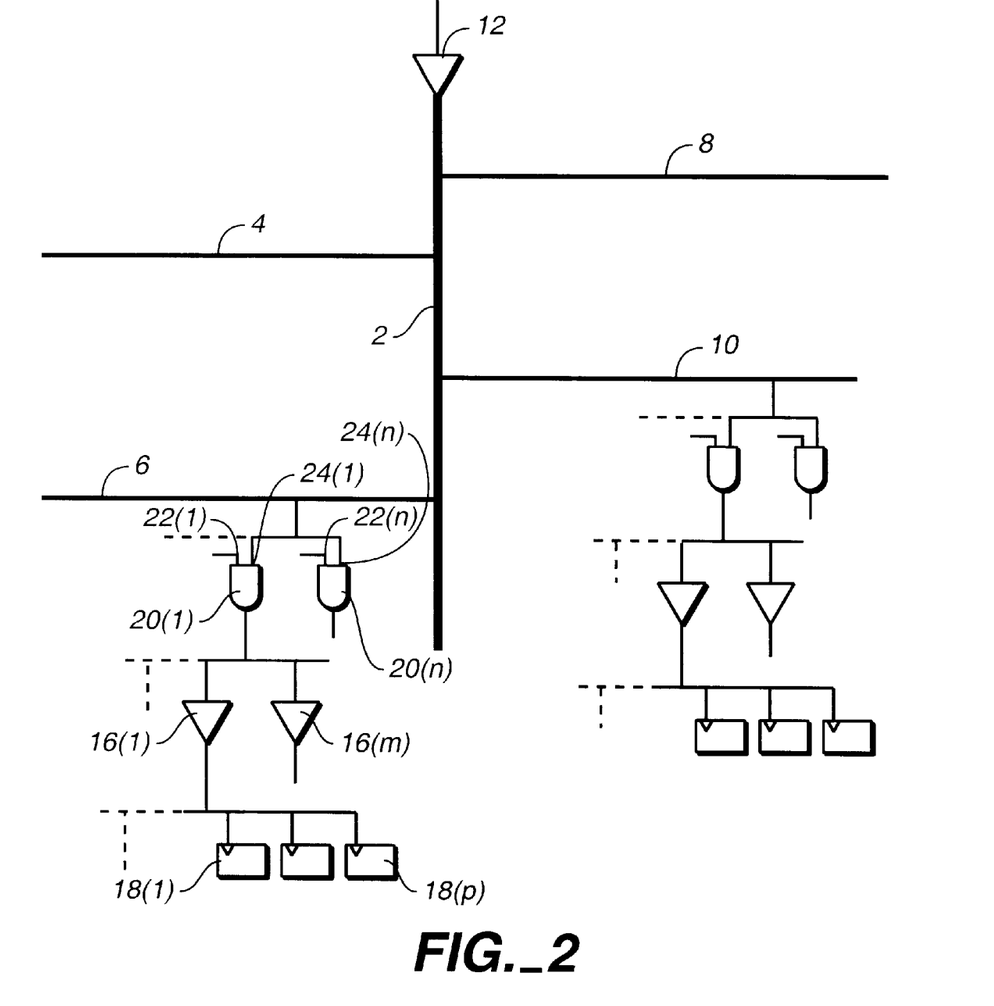
FIG. 2 shows a gated BCT-clock scheme according to the invention.

FIG. 2 shows a BCT-clock system using gate circuits 20(1) . . . 20(n) for generating derived clock signals by gating the master clock signal from the master clock line 2 gated in a master clock signal generator 21. The gating circuits 20(1) . . . 20(n) are AND2-gates (AND2-gates are gates of LSI Logic Corporation), a first input 22(1) . . . 22(n) of the gate circuits is connected to an enable signal generator (25), and a second input 24(1) . . . 24(n) of the gate circuits is connected to the master clock signal generator 21 via branch clock line 6 and master clock line 2. The derived clock signals have a frequency reduced by a factor of n>1 (n=2, . . . N) adapted to the need of the load circuits 18(1) . . . 18(p) in a particular domain.

The master clock signal itself can also be the clock signal for a domain in which case the gate circuits 20(1) . . . 20(n) are just kept open for the master clock signals. The master clock signal and/or the derived clock signals for a particular domain are routed to the load circuits 18(1) . . . 18(n) of the related domain whereby the clock signals are generated, distributed and routed in a synchronous manner.

The derived clock signals DCS are the outputs of the gating circuits 20(1) . . . 20(n) and are fed to the buffers 16(1) . . . 16(m) and from there to the load circuits 18(1) . . . 18(p).

Figure 3:
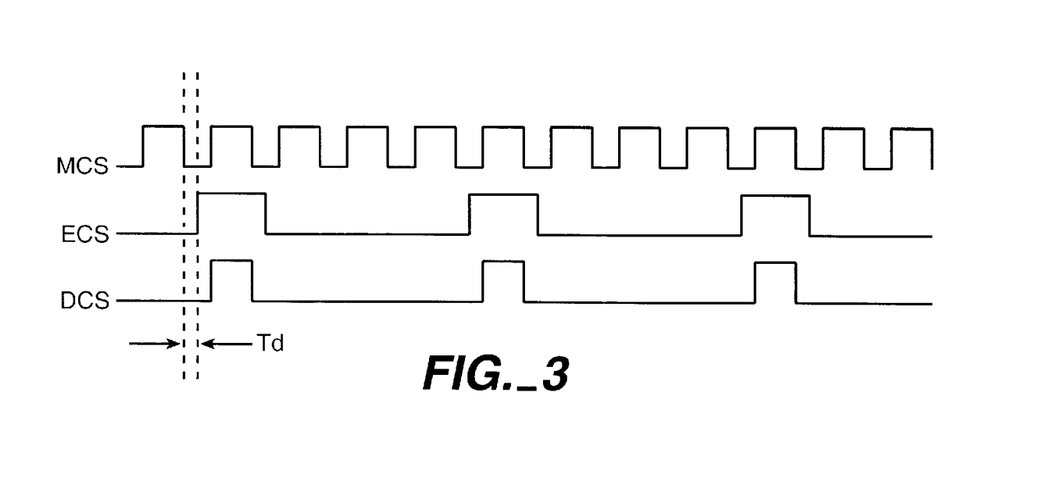
FIG. 3 shows the time relationship of the master clock signal, the gating signal and the gated derived clock signal.

FIG. 3 shows the relationship of the master clock signal MCS, the enable clock signal ECS and the derived clock signal DCS. There is a small delay Td caused by the decoding of the enable clock signal ECS. This delay Td removes the possible spike problem before such a problem can even come about. Since the enable clock signals ECS are generated by using the falling edge of the master clock signal MCS to run a counter, the enable clock signals ECS will start just after the falling edge of the master clock signal MCS and will end at the same time in the following clock period whereby the clock edges are protected.

Figure 4:
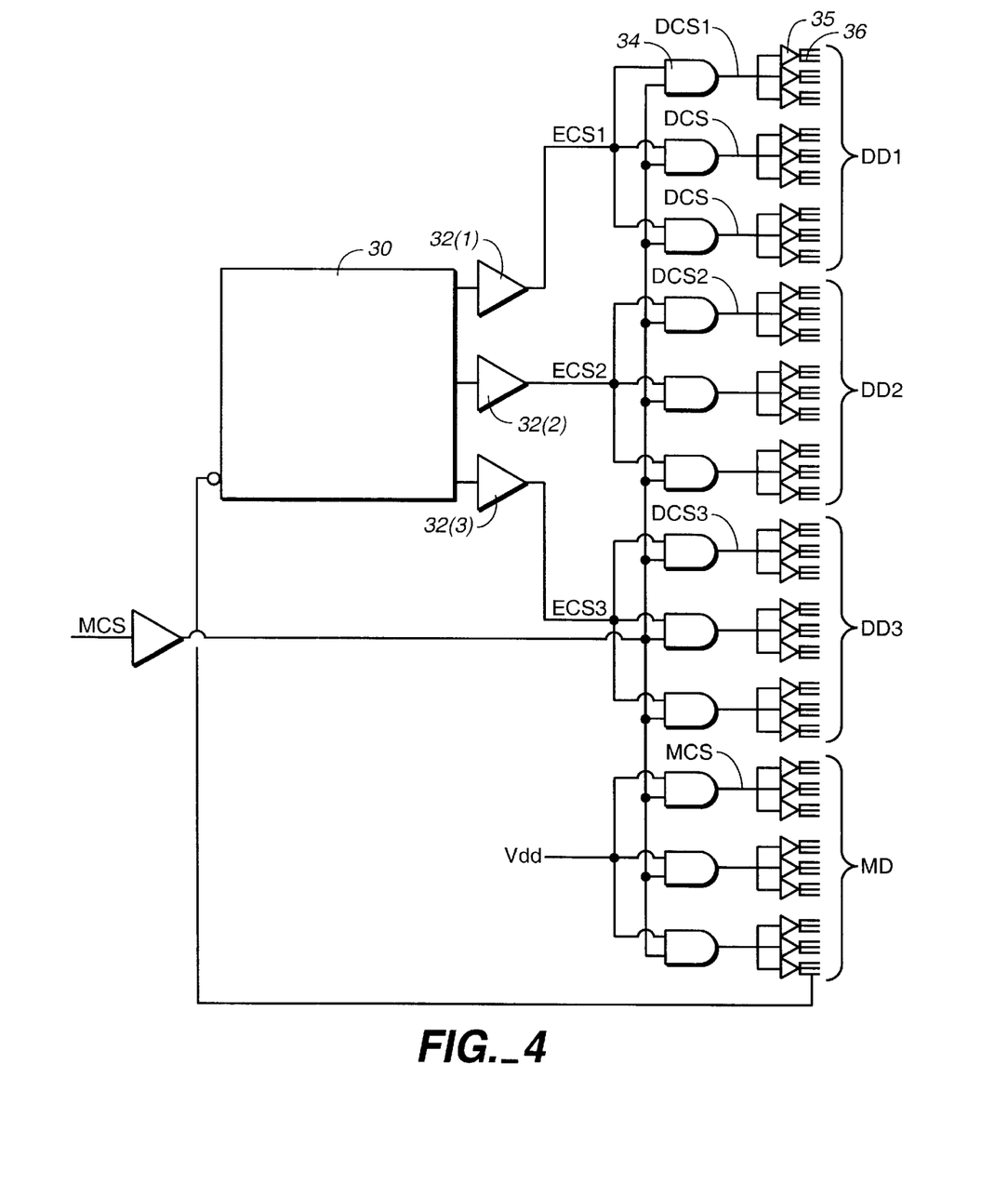
FIG. 4 shows a circuit diagram according to which the master clock signal and gated derived clock signals are generated and supplied to load circuits.

FIG. 4 shows an embodiment of the BCT-clock system with one domain having the master clock signal and three subdomains having three different derived clock signals DCS1, DCS2, DCS3. The derived clock signals DCS1, DCS2, DCS3 are blanked out of the master clock signal MCS by means of enable clock signals ECS1, ECS2, ECS3. The enable clock signals ECS1, ECS2, ECS3 are generated in an enable signal generator 30 and fed through buffers 32(1), 32(2), 32(3) to the respective gates 34. The other input of the gates 34 is fed by the master clock signal MSC, and the derived clock signals DCS1, DCS2, DCS3 are fed from the gates 34 via buffers 35 to the load circuits 36 in the corresponding domains DD1, DD2, DD3. In the case of the domain MD which is clocked by the master clock signal, the enable inputs of the gates 34 are connected to Vdd. The clock signal on the outputs of the load circuits 36 of the master clock domain MD which is the master clock signal, is fed back as a clock signal to the input of the enable signal generator 30 via line 38.

Figure 5:
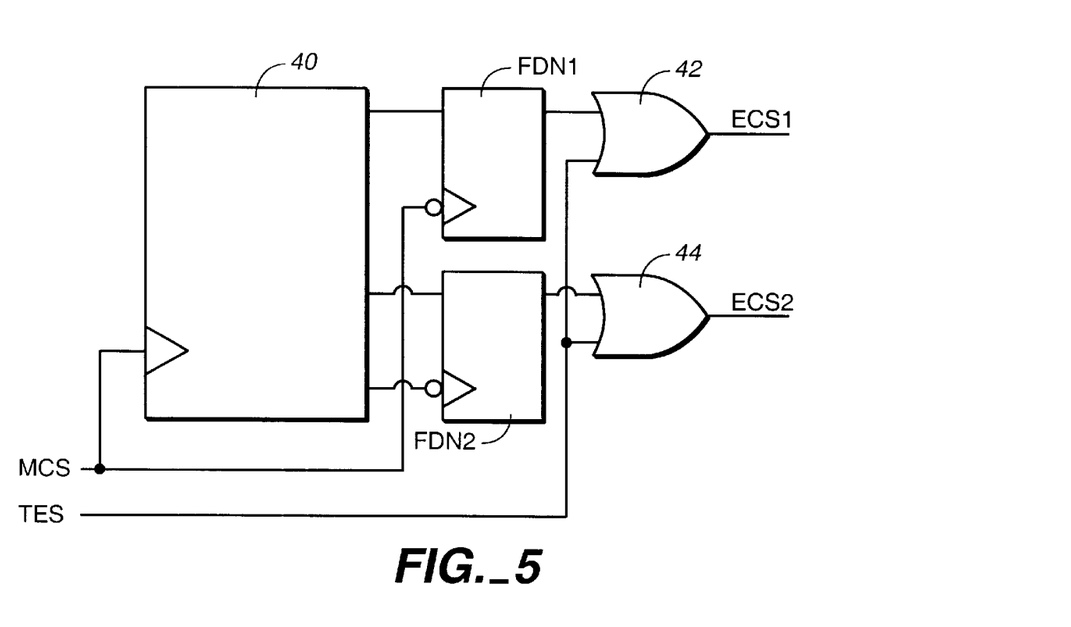
FIG. 5 shows a circuit diagram for the enable clock generator.

FIG. 5 shows an embodiment of the enable signal generator 30 shown in FIG. 4. The enable signal generator 30 comprises a state machine 40 which is clocked by the master clock signal MCS. The two outputs of the state machine 40 are connected to negative edge flip flop circuits FDN1, FDN2 (FDN are negative edge flip-flops of LSI Logic Corporation), which are also clocked by the master clock signal. The outputs of the two flip flops FDN1 and FDN2 are inputted to OR2-gates 42, 44 (OR2-gates are elements of LSI Logic Corporation) which output enable clock signals ECS1, ECS2. The other two inputs of the OR2-gates 42, 44 are fed by the scan-test enable signal TES. The enable clock signals ECS1, ECS2 are thus generated by the state machine 40 which uses only negative edge flip flops FDN1, FDN2. The enable clock signals ECS1, ECS2 are registered with the negative edge flip flops FDN1, FDN2. The register is excluded in the testing mode (scan test). In the OR2-gates 42, 44, the enable clock signals ECS1, ECS2 are subjected to an OR-operation with the scan-test enable signal TES. If the scan-test enable signal is high, all enable clock signals ECS1, ECS2 are also high which means that in the scan test mode all clock signals are active and one single test clock is used throughout the clock system. The OR2-gates 42, 44 are the only logic level between the flip flops FDN1, FDN2 and buffers (not shown) leading to the gating circuits.

The gated BCT-scheme can also be embodied by using OR-gates. This has the advantage of a maximum of power saving. The standard load circuits (FFs) have a minimum power consumption if the clock signal is in the high state because the master-latch of the flip flop is locked in such a case and a change in the data does not consume any power. A further advantage would be that no FDN circuits is needed in the enable clock signal generator. The only difference with respect to the signal processing as compared to the previous embodiment is the fact that the enable clock signals are low active and need to be generated by the positive edge of the master clock signal.

In the above embodiments, the derived clock signals are defined as being clock signals of a lower frequency generated by blanking out the necessary number of master clock cycles. The master clock signal and all derived clock signals will be generated from a single source and laid out as a single clock net using BCT tools. By using an enable (gating) scheme for all clocks, each clock domain can be driven at the lowest possible frequency thus reducing the power consumption. The master clock and all derived clocks are edge synchronous, and the over all skew is well under control. It is possible to generate a test clock signal which drive all load flip flops at the same rate for scan testing which reduces the test program over head and complexity.

The enable clock signals will be generated by using the falling edge of the master clock signal. Thereby, the enable clock signals start just after the falling edge of the master clock signal and ends at the same time in the following clock period. The enable clock signals are generated clock signals for each clock domain while taking care that the set up of each signal is identical.

Figure 6:
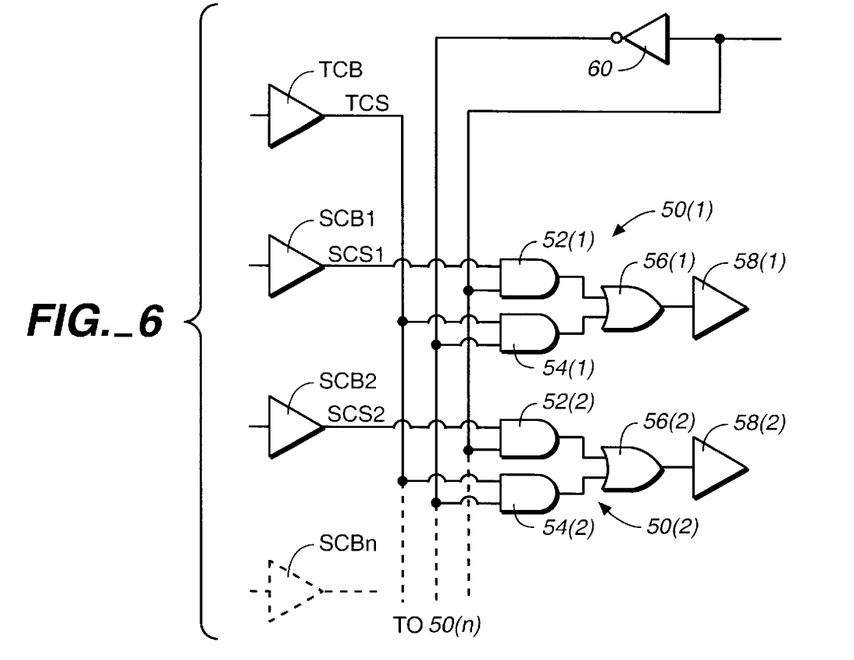
FIG. 6 shows a BCT-clock scheme using multiplexer units as clock circuits.

FIG. 6 shows an embodiment of a chip having a plurality of BCT-clock systems using multiplexer units 50(1) . . . 50(n) at the entrance locations of the clock systems. The multiplexer units 50(1) . . . 50(n) are A022-cells (A022-cells are elements of LSI Logic Corporation) consisting of two AND-gates 52(1) . . . 52(n) and 54(1) . . . 54(n) and an OR2-gate 56(1) . . . 56(n) which is supplied with the outputs of the AND-gates. The outputs of the A022-cells is fed to buffers 58(1) . . . 58(n) and from there to the related clock system and the load circuits thereof.

Each clock system is driven by an A022-cell 50(1) . . . 50(n) followed by one of the buffers 58(1) . . . 58(n). The system clock signal SCS1 . . . SCSn is fed to the A-pins of the A022-cell from a corresponding system clock buffer SKB1 . . . SKBn. The load circuits of the clock system are connected to the C-pin of the buffer 58(1) . . . 58(n) that follows the A022-cell 50(1) . . . 50(n). The test clock signal is supplied from a test clock buffer TCB to the C-pin of the A022-cell. The control logic to switch from a test mode to a system mode, is connected to the B- and D-pins of the A022-cell and comprises a buffer for driving the test enable signal and an inverter 60 for driving an inverted test enable signal on an inverted line.

Figure 7:
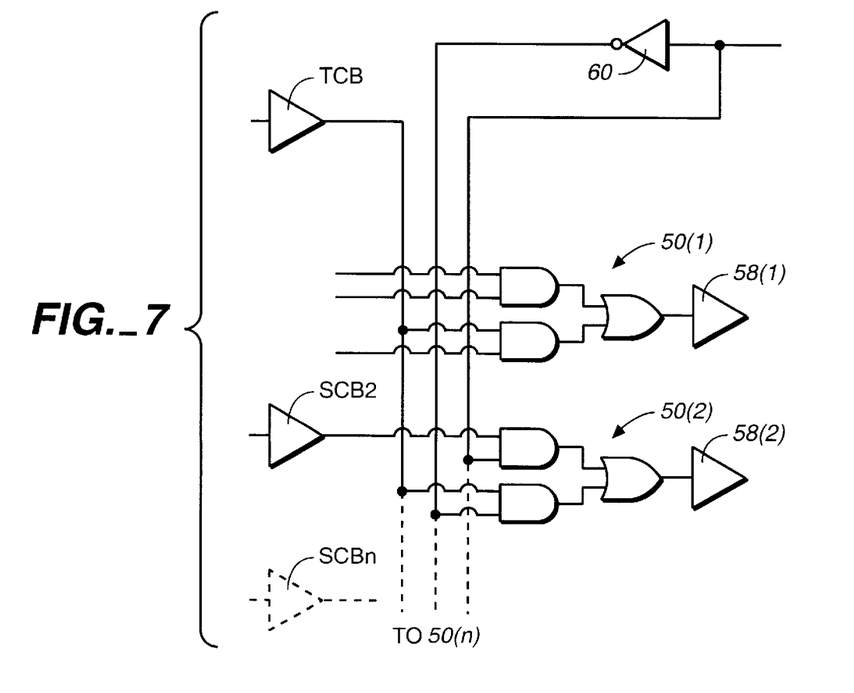
FIG. 7 shows a modified circuit like FIG. 6.

FIG. 7 shows the case when the test clock buffer TCB is identical with one of the system clock buffers, for example the system clock buffer SCB1 of FIG. 6 (pin sharing). In such a case the test clock buffer and the system clock buffer SCB1 are one and the same circuit, as shown in FIG. 7. The inputs to the A022-cell 50(1) are connected as shown in FIG. 7 to Vss and Vdd respectively as shown. The output of the test clock buffer and system clock buffer is connected to one of the inputs of the A022-cell 50(1) as shown. The rest of the circuit of FIG. 7 is identical to the circuit in FIG. 6.

In the embodiments of FIGS. 6 and 7 all clock signals are combined in a multiplexed BCT so that only one test clock signal can be used during testing. This makes all parts of the testing more easy, because a totally synchronous design is present in the test mode even if there are multiple asynchronous clocks in functional operation. Thereby, testing of several clock domains by using many asynchronous interface circuits during testing can be avoided. The multiplexed gated BCT uses multiplexer units or A0-gates instead of buffers allowing to multiplex a test clock signal into the system. The test clock signal used is fed to all load circuits (FFs) and the test clock signal has a minimal skew at the load circuit by construction.

The multiplexer units can also be used to generate derived clock signals as for example the gate circuits 34 in FIG. 4. For this purpose, the multiplexer units have to be fed with enable signals and the master clock signal or a test clock signal and a test enable signal. The output of the multiplexer units is, in this case, the master clock signal or the derived clock signal or the test clock signal.

The gate circuits 20(1) . . . 20(n), 34 or the multiplexer units 50(1) . . . 50(n) used for generating the derived clock signals are, in case of a BCT system, located at the entrance of a clock domain being supplied by tributaries (see FIG. 2) which in turn are connected to a main trunk or are located at a layer further down the path to the load circuits, for example at the layer for the buffers 35 (FIG. 4). The first mentioned alternative is advantageous in cases where a large number of load circuits (FFs) is used, whereas the second mentioned alternative is advantageous in cases where a comparatively small number of load circuits, for example 20 load circuits, per buffer is used.

New characteristics and advantages of the invention covered by this document have been set forth in the foregoing description. It will be understood, however, that this disclosure is, in many respects, only illustrative. Changes may be made in details, particularly in matters of shape, size, and arrangement of parts, without exceeding the scope of the invention. The scope of the invention is, of course, defined in the language in which the appended claims are expressed.

Although the present invention has been described with reference to preferred embodiments, workers skilled in the art will recognize that changes may be made in form and detail without departing from the spirit and scope of the invention.

What is claimed is:

1. A method of providing clock signals to a plurality of load circuits in respective clock domains of a ASIC device having a balanced clock tree including a master clock line and branched clock lines feeding the clock signals to the load circuits and wherein the balanced clock tree is balanced with respect to delays and loads in the clock domains of the ASIC device to which the branched clock lines supply the clock signals, wherein the method comprises:

a) generating derived clock signals by gating the master clock signal such that the derived clock signals have a frequency reduced from a frequency of the master clock signal by a factor n>1 (n=2, . . . , N), which is adapted to a need of the load circuits in a respective one of the clock domains, and b) routing either the master clock signal or the derived clock signal for a respective one of the clock domains to the load circuit of the respective clock domain, wherein the derived clock signals are generated and routed in a synchronous manner with respect to each other and the master clock signal.

2. The method of claim 1 and further comprising:

c) generating a respective enable signal for each of the clock domains, wherein for each of the derived clock signals, gating is achieved in step b) by blanking out an appropriate number of master clock cycles in the master clock signal using the respective enable signal.

3. The method of claim 1, wherein the master clock signal has pulses with falling edges and wherein the method further comprises:

generating at least one enable signal using the falling edges of selected ones of the pulses of the master clock signal; and wherein the derived clock signals are generated in step b) by gating the master clock signal with the at least one enable signal.

4. The method of claim 3, wherein the at least one enable signal has pulses with rising edges that are delayed from the falling edges of the selected pulses of the master clock signal.

5. A method of providing clock signals to load circuits in a plurality of clock domains of a ASIC device, the method comprising:

providing a plurality of balanced clock tree systems, each system including a master clock line and branched clock lines, which feed the clock signals to respective ones of the load circuits and are balanced with respect to delays and loads in the clock domains of the ASIC device to which the branched clock lines supply the clock signals; and multiplexing a master clock signal received from the master clock line with a test clock signal onto each of the branched clock lines based on a test enable signal whereby the master clock signal or the test clock signal is supplied to the load circuits and has synchronous clock edges on all of the branched clock lines.

6. The method of the claim 5 and further comprising:

generating derived clock signals by gating the master clock signal such that each of the derived clock signals has a frequency reduced from a frequency of the master clock signal by a factor n>1 (n=2, . . . , N), which is adapted to need of the load circuits in a respective one of the clock domains;

routing either the master clock signal or the derived clock signal for a respective one of the clock domains to the load circuit of that domain whereby the derived clock signals are generated and routed in a synchronous manner with respect to the master clock signal.

7. The method of the claim 6, wherein the step of generating the derived clock signals is performed during the step of multiplexing in a combined multiplexing and gating circuit such that the combined circuit outputs the master clock signal or the derived clock signal or the test clock signal for each of the plurality of clock domains.

8. The method of claim 6, wherein the step of generating the derived clock signals comprises blanking out an appropriate number of master clock cycles of the master clock signal using a respective enable clock signal for each of the clock domains.

9. The method of claim 6 wherein the derived clock signals are generated by gating the master clock signal with an enable clock signal, which has pulses that are generated from falling edges of selected, respective pulses of the master clock signal.

10. The method of claim 6 wherein the pulses of the enable clock signal are delayed from the falling edges of the respective pulses of the master clock signal.

11. An ASIC device comprising:

a plurality of clock domains;

a plurality of load circuits within respective ones of the clock domains;

a balanced clock tree including a master clock line and branched clock lines, which feed a master clock signal from the master clock line to the load circuits, wherein the balanced clock tree is in balance with respect to delays and loads in the plurality of clock domains of the ASIC device to which the branched clock lines supply the master clock signal; and gating circuits, which are coupled to the balanced clock tree to gate the master clock signal with an enable clock signal and thereby produce derived clock signals, wherein each of the derived clock signals have a frequency reduced from a frequency of the master clock signal by a factor of n>1 (n=2, . . . , N), which is adapted to a need of the load circuits in a respective one of the clock domains; and means for routing either one of the master clock signal or the derived clock signal for a respective one of the clock domains to the load circuits of the respective domain, and wherein the derived clock signals are generated and routed in a synchronuous manner with respect to the master clock signal.

12. The device of claim 11 and further comprising an enable clock signal generator and a master clock signal generator, wherein the gating circuits comprise AND-gates, wherein a first input of each gating circuit is connected to the enable clock signal generator, and a second input of each gating circuit is connected to the master clock signal generator.

13. The device of claim 11, wherein each of the gating circuits is located at the entrance of a respective one of the clock domains being supplied by tributaries of the balanced clock tree which in turn are connected to the master clock line or are located at a layer further down the means for routing, toward the load circuits.

14. The device of claim 11, which further comprises:

a test clock signal input;

a test enable signal input; and a multiplexer circuit coupled to at least one of the branched clock lines to multiplex that branched clock line with the test clock signal input based on the test enable signal input.

15. An ASIC device comprising:

a plurality of clock domains;

a plurality of load circuits within respective ones of the clock domains;

a balanced clock tree including a master clock line and branched clock lines, which feed clock signals from the master clock line to the load circuits, and wherein the balanced clock tree is in balance with respect to delays and loads in the plurality of domains of the ASIC device to which the branched clock lines supply the clock signals; and multiplexer units coupled to the branch clock lines of the balanced clock tree, which multiplex a master clock signal received from the master clock line with a test clock signal to produce a selected clock signal on each of the branched clock lines based on a test enable signal, whereby the selected clock signal is supplied to the load circuits with synchronous clock edges in the plurality of clock domains.

16. The device of claim 15, further comprising:

gating circuits, which are coupled to the balanced clock tree to gate the selected clock signal with an enable clock signal and thereby produce derived clock signals, wherein each of the derived clock signals have a frequency reduced from a frequency of the selected clock signal by a factor of n>1 (n=2, ..., N), which is adapted to a need of the load circuits in a respective one of the clock domains, and means for routing the selected clock signal or the derived clock signal for a respective one of the clock domains to the load circuits of the respective clock domain, whereby the selected clock signal and the derived clock signals are generated, distributed and routed in a synchronous manner.

17. The device of claim 16, wherein the gating circuits are coupled to the multiplexer units to form a combined circuit, which outputs the master clock signal or the derived clock signals or the test clock signal.

18. The device of claim 17, wherein the combined circuit comprises a first input, which is coupled to receive the enable clock signal, a second input, which is coupled to receive the master clock signal, a third input, which is coupled to receive the test enable signal and a fourth input, which is coupled to receive the test clock signal.

19. The device of claim 16, wherein each of the gating circuits is located at the entrance of a respective one of the clock domains being supplied by tributaries of the balanced clock tree which in turn are connected to the master clock line or are located at a layer further down the means for routing the selected clock signal, toward the load circuits.

20. The device of claim 15, which further comprises an inverter, which receives the test enable signal and responsively generates an inverted test enable signal, wherein the multiplexer units are controlled by the test enable signal and the inverted test enable signal.

21. The device of claim 15, wherein a buffer or an inverter is provided as a clock driver between each of the multiplexer units and the load circuits.

* * * * *